United States Patent [19]

Kobayashi et al.

[11] Patent Number: 5,287,317
[45] Date of Patent: Feb. 15, 1994

[54] NON-VOLATILE SEMICONDUCTOR MEMORY DEVICE WITH OVER-ERASING PREVENTION

[75] Inventors: Kazuo Kobayashi; Makoto Yamamoto, both of Hyogo, Japan

[73] Assignee: Mitsubishi Denki Kabushiki Kaisha, Tokyo, Japan

[21] Appl. No.: 721,773

[22] Filed: Jun. 28, 1991

[30] Foreign Application Priority Data

Jul. 3, 1990 [JP] Japan .................. 2-176895

[51] Int. Cl.$^5$ ......................... G11C 7/00; G11C 11/34
[52] U.S. Cl. .................... 365/218; 365/185; 365/900
[58] Field of Search ................. 365/218, 900, 189.07, 365/185

[56] References Cited

U.S. PATENT DOCUMENTS

| 4,811,294 | 3/1989 | Kobayashi et al. | 365/218 |
| 4,905,195 | 2/1990 | Fukuda et al. | 365/189.05 |
| 5,053,990 | 10/1991 | Kreifels | 365/218 |
| 5,122,985 | 6/1992 | Santin | 365/218 |
| 5,132,935 | 7/1992 | Ashmore, Jr. | 365/218 |
| 5,172,338 | 12/1992 | Mehrota | 365/189.07 |

FOREIGN PATENT DOCUMENTS

4119394A1 12/1991 Fed. Rep. of Germany .

OTHER PUBLICATIONS

"A 90-ns One-Million Erase/Program Cycle 1-Mbit Flash Memory", Virgil N. Kynett et al., IEEE Journal of Solid-State Circuits, vol. 24, No. 5, Oct. 1989, pp. 1259-1264.

An In-System Reprogrammable 32KX8 CMOS Flash Memory, vol. 23, No. 5, Oct. 1988, Kynett et al.

ISSCC 89/Thursday, Feb. 16, 1989/East Grand Ball Room/12:15 p.m. "Nonvolatile Memories", Kynett et al.

Primary Examiner—Timothy P. Callahan
Attorney, Agent, or Firm—Lowe, Price, LeBlanc & Becker

[57] ABSTRACT

The present invention is a non-volatile semiconductor memory device comprising a plurality of memory cells arranged in an array of rows and columns and including electrically erasable and programmable non-volatile memory transistors, row selector and column selector for decoding an externally inputted address signals to select memory cells in row and column directions, respectively. A rise detecting circuit detects the rise of a power supply, so that a latch of a latch circuit is released. A determination circuit determines whether or not the data subjected to erasing read from the memory cells is erased, so that if the read data is erased, the latch circuit is latched to set an erase-inhibit mode, thereby preventing over-erasing.

9 Claims, 13 Drawing Sheets

PRIOR ART

NON-VOLATILE SEMICONDUCTOR MEMORY DEVICE WITH OVER-ERASING PREVENTION

BACKGROUND OF THE INVENTION

1. Field of the Invention

The present invention relates generally to non-volatile semiconductor memory device. More particularly, the present invention relates to a non-volatile semiconductor memory device having a function of inhibiting erroneous erasing of electrically and collectively erasable flash EEPROM (Electrically Erasable and Programmable Read Only Memory).

2. Description of the Background Art

Figure 10:
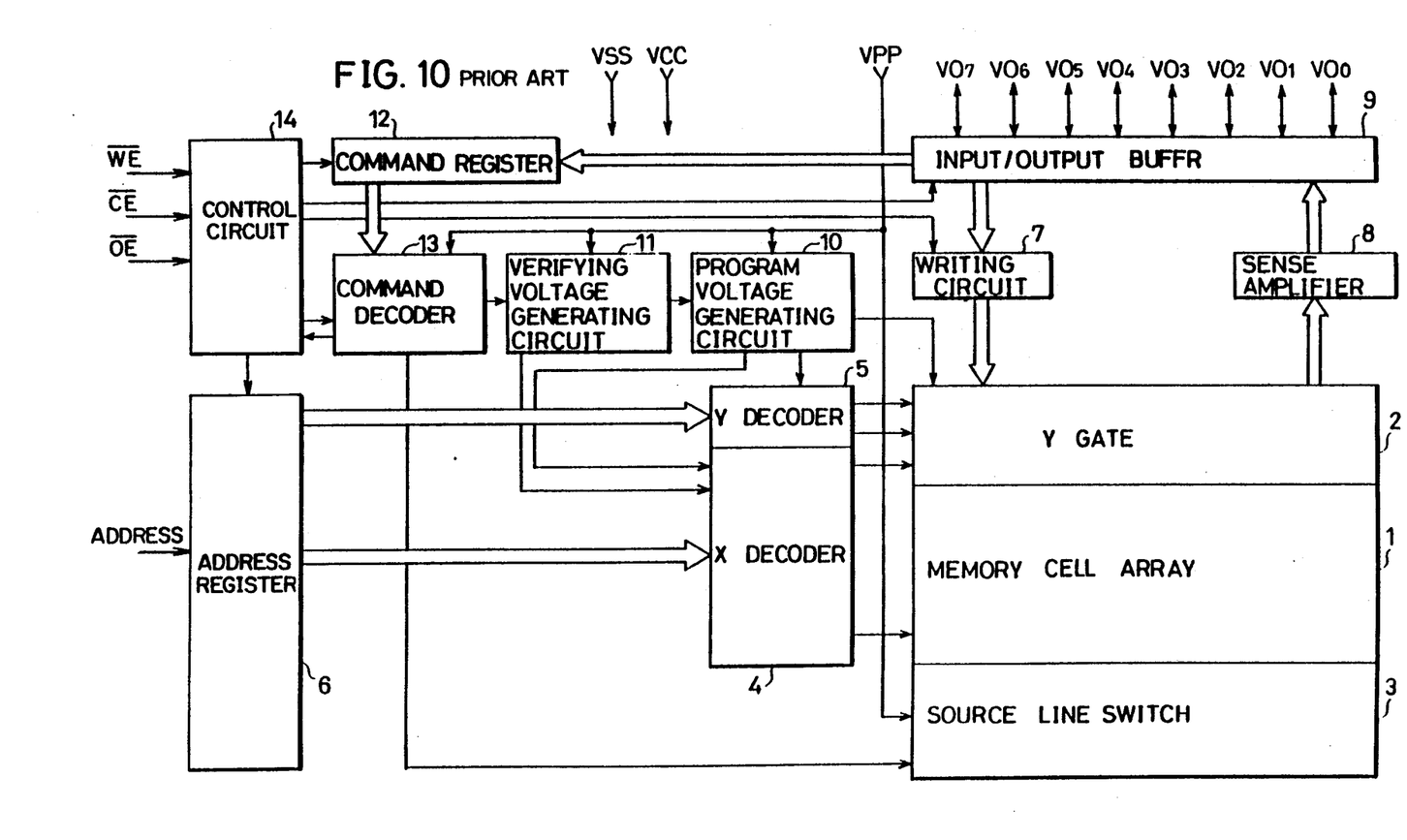
FIG. 10 is a schematic block diagram of a conventional flash EEPROM.

FIG. 10 is a schematic block diagram of a conventional flash EEPROM. The flash EEPROM shown in FIG. 10 is disclosed in "IEEE Journal of Solid-State Circuits" Vol. 23, No. 5, pp. 1157–1163, October 1988. Referring to FIG. 10, provided on the periphery of a memory cell array 1 are a Y gate 2, a source line switch 3, an X decoder 4 and a Y decoder 5. The X decoder 4 and the Y decoder 5 are connected to an address register 6 to which address signals are externally inputted. A writing circuit 7 and a sense amplifier 8 are connected to the memory cell array 1 through the Y gate 2. The writing circuit 7 and the sense amplifier 8 are connected to an input/output buffer 9.

A program voltage generating circuit 10 and a verify voltage generating circuit 11 are provided for generating voltages different from externally applied power supplies Vcc and Vpp and applying the same to the Y gate 2 and the X decoder 4. A command register 12 and a command decoder 13 are provided which set an operation mode in response to the externally inputted data and a control circuit 14 receives externally applied control signals $\overline{WE}$, $\overline{CE}$ and $\overline{OE}$.

Figure 11:
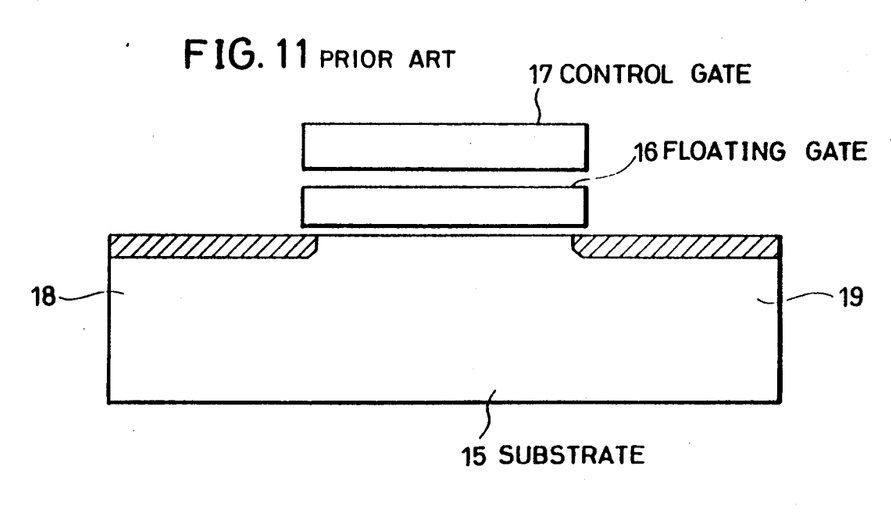
FIG. 11 is a sectional view of a memory cell.

FIG. 11 is a sectional view of the memory cell shown in FIG. 10. Referring to FIG. 11, the memory cell comprises a floating gate 16 formed on a semiconductor substrate 15, a control gate 17, a source diffusion region 18 and a drain diffusion region 19. An oxide film between the floating gate 16 and the substrate 15 is as thin as about 100 Å, enabling tunneling of the electrons in the floating gate 16 by Fowler-Nordheim tunneling mechanism. The memory cell 1 operates as follows. Namely, during the programming, a program voltage of about 6.5 V is applied to the drain 19 and Vpp (12 V) is applied to the control gate 17, and the source 18 is grounded. Hot electrons are injected into the floating gate in the same manner as in EPROM's. The threshold voltage of the memory cell 1 is increased in this way. This is defined as the storage of the information "0".

Conversely, erasing is carried out by disconnecting the drain 19 and grounding the control gate 17 to apply the Vpp to the source 18. The Fowler-Nordheim tunneling occurs due to a potential difference between the source 18 and the floating gate 16, whereby the electrons in the floating gate 16 are emitted. The threshold voltage of the memory cell 1 is lowered in this way, which is defined as the storage of the information "1".

Figure 12:
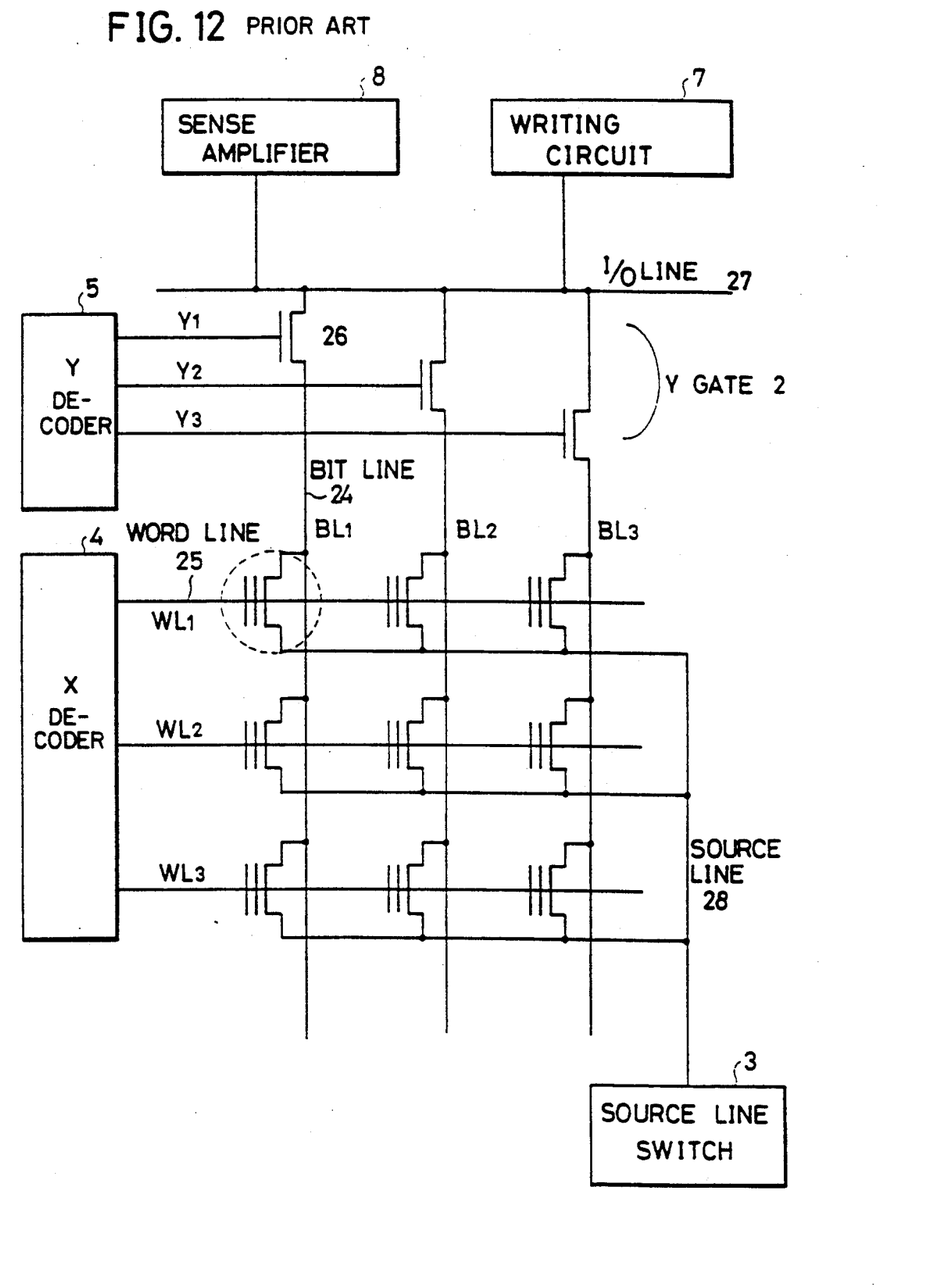
FIG. 12 is a circuit diagram of a peripheral circuit shown in FIG. 11.

FIG. 12 is a diagram showing the structure of the memory cell array shown in FIG. 10, assuming that the memory cell array includes 9 memory cells. Referring to FIG. 12, drains of three memory cells are connected to a bit line and control gates of the three memory cells are connected to a word line. The word line 25 is connected to the X decoder 4 and the bit line 24 is connected to an I/O line 27 through an Y gate transistor 26 having a gate receiving the output of the Y decoder 5. The I/O line 27 is connected to the sense amplifier 8 and the writing circuit 7 and a source line 28 is connected to the source line switch 3.

Description will be made of an operation of a conventional flash EEPROM with reference to FIGS. 10 through 12. First, an operation will be described in a case where data is written in the memory cell 1 encircled by a dotted line shown in FIG. 12. The writing circuit 7 is activated in response to externally inputted data, so that the program voltage is supplied to the I/O line 27. At the same time, the Y gate 26 and the word line 25 are selected by the Y decoder 5 and the X decoder 4, respectively, by using the address signals, so that the Vpp is applied to the memory cell 1. The source line 28 is grounded by the source line switch 3 during the programming. In this way, current flows to only a single cell in FIG. 12, whereby hot electrons are generated and the threshold voltage thereof is increased.

Conversely, erase is carried out as follows. First, the X decoder 4 and the Y decoder 5 are inactivated, thereby causing all the memory cells 1 to enter a non-selected state. Namely, all the word lines of each memory cell are grounded and the drains are disconnected. Meanwhile, a high voltage is applied to the source line 28 by the source line switch 3. The threshold voltages of the memory cells shift to a lower level due to the tunneling phenomenon. Since the source line 28 is shared, erase is made for all the memory cells.

A read operation will be described. Similarly to the writing operation, reading the memory cell encircled by the dotted line of FIG. 12 will be described. First, the address signals are decoded by the Y decoder 5 and the X decoder 4, so that the output of selected Y gate 26 and the word line 25 attain the "H" (logical high) level. At this time, the source line 28 is grounded by the source line switch 3. In the case where the memory cell is programmed, even if the "H" level signal is applied to the control gate of the memory cell from the word line 25, the memory cell is not turned on, whereby no current flows from the bit line 24 to the source line 28.

Conversely, when a memory cell is erased, the memory cell is turned on, whereby current flows from the bit line 24 to the source line 28. The sense amplifier 8 detects whether or not the current flows through the memory cell to obtain the read data "1" or "0". Data writing and reading of the flash EEPROM are performed in this way.

Meanwhile, another example of an ROM is an EPROM allowing data to be erased by irradiating ultraviolet rays. In such an EPROM, when a floating gate becomes electrically neutral, no more electron is emitted from the floating gate, so that a threshold voltage of a memory transistor never becomes less than about 1 V. In the tunneling phenomenon, the electrons are excessively emitted from the floating gate, so that the floating gate might be charged to be positive. This phenomenon is referred to as over-erase or over-erasure.

If the threshold voltage of the memory transistor becomes negative, the following reading and writing will be adversely affected. Namely, in the reading, even if a word line level is unselected, current flows from the bit line 24 through the over-erased memory transistor. In this case, when the memory cell, which is programmed successfully, is selected, "φ" can not be read out because of the current flow of an over-erased cell. In addition, since leakage current flows through a over-erased memory cell during the writing, the writing characteristics are deteriorated, disturbing the writing.

Therefore, there is a method of preventing memory cells from excessive-erasing by reading after the erase to verify whether the erase is properly done or not (referred to as erase verify, hereinafter) and erase again when there is a bit which is not erased.

Figure 13:
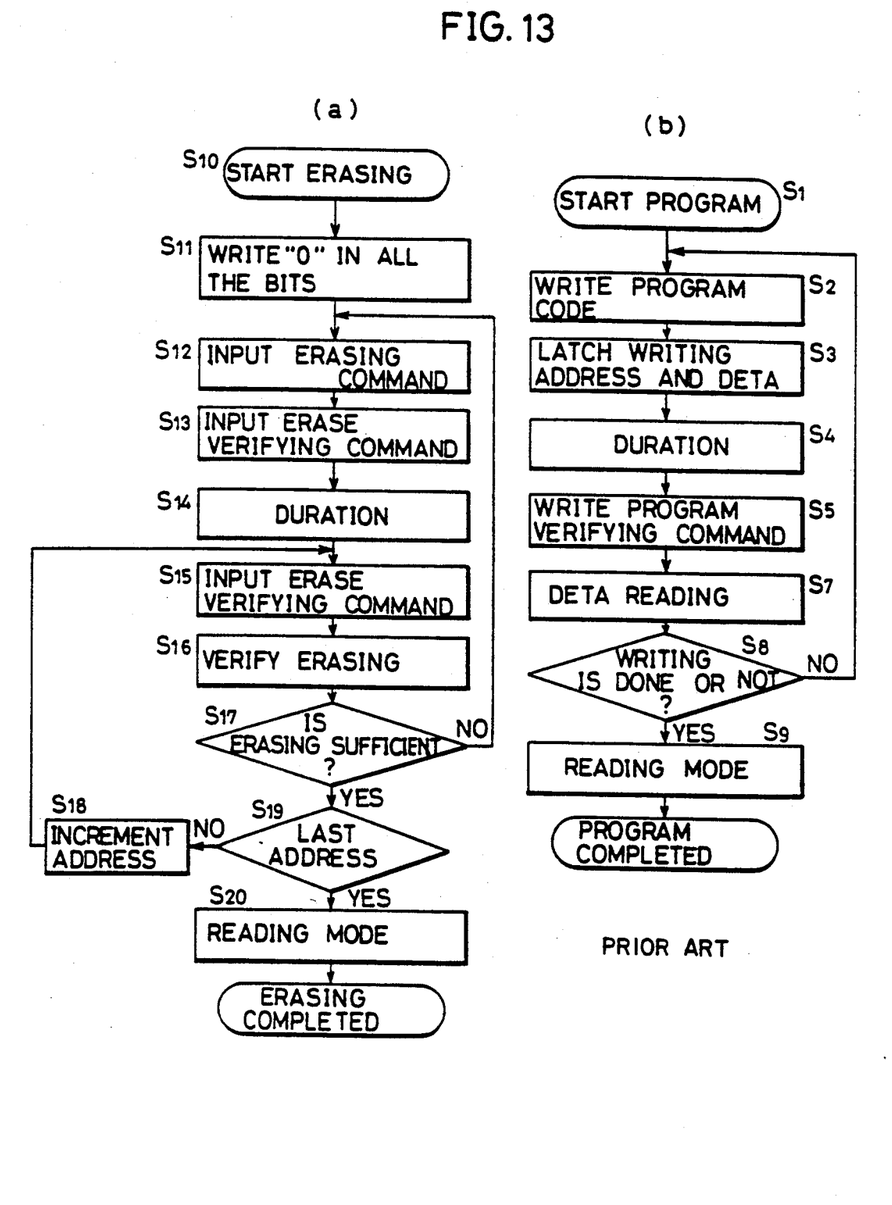
FIG. 13 is a flow chart explaining operations of the conventional flash EEPROM.
Figure 14A:
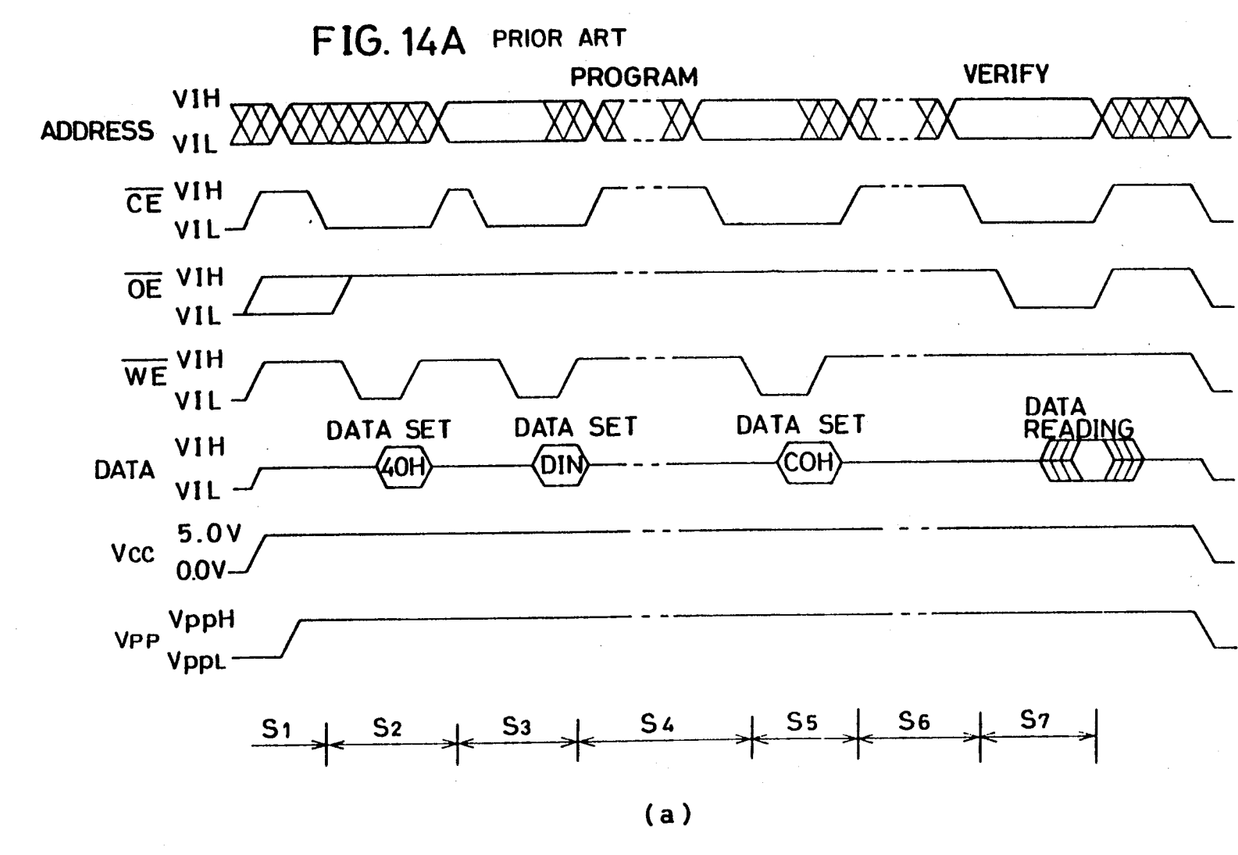
FIGS. 14A and 14B are timing charts explaining programming and erasing operations of the conventional flash EEPROM.
Figure 14B:
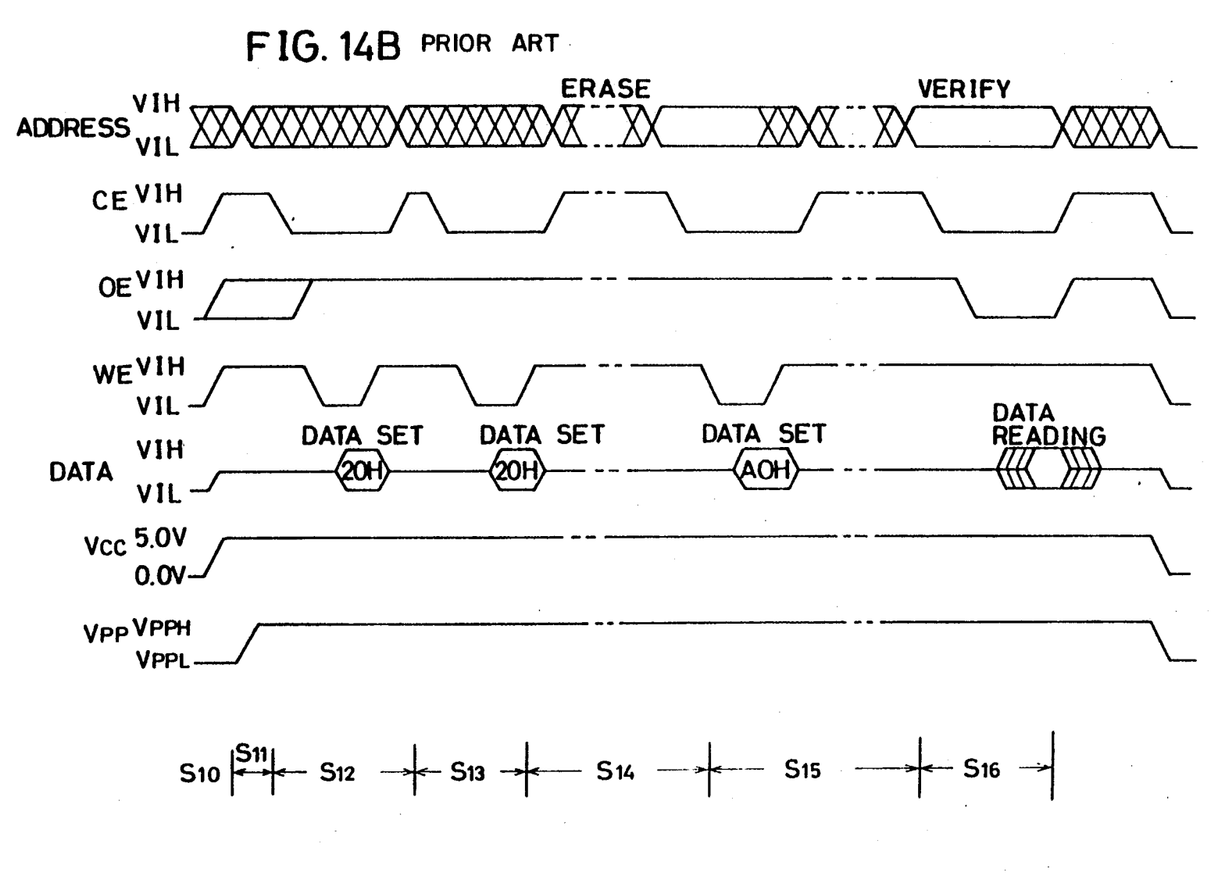

FIG. 13 shows flow charts of erase and program including the above-described verifying operation and FIGS. 14A and 14B are timing charts showing both operations.

Referring to FIGS. 10, 13, 14A and 14B, programming and erasing operations will be described. In the conventional flash EEPROM, program and erase modes are set by a combination of input data. Namely, mode setting is carried out by the data at the rise of the write enable signal $\overline{WE}$. First program will be described with reference to FIG. 14A. First, Vcc and Vpp are caused to rise in step (abbreviated to S in the drawings) S1 and then, the write enable signal $\overline{WE}$ is caused to fall in step S2. Thereafter, input data $40_H$ is latched in the command register 12 at the rise of the write enable signal $\overline{WE}$. Then, the input data is decoded by the command decoder 13, changing the operation mode to the program mode.

Then, in step S3, the write enable signal $\overline{WE}$ is again caused to fall and the external address signals are latched in the address register 6, then the data is latched in the writing circuit 7 at the rise of the write enable signal $\overline{WE}$. Then, the program pulse is generated from the program voltage generating circuit 10 and applied to the X decoder 4 and the Y decoder 5. The programming is carried out in this way.

Then, the write enable signal $\overline{WE}$ is caused to fall and the input data ($CO_H$) is inputted and latched in the command register 12. Subsequently, at the same time as the rise of the write enable signal $\overline{WE}$, the operation mode changes to the program verification mode (S6). At this time, the program verify voltage ($\sim$6.5 V) is generated in the chip by the verify voltage generating circuit 11 and applied to the X decoder 4 and the Y decoder 5. As a result, the voltage applied to the control gate of the memory cells becomes higher than that in the ordinary reading ($\sim$5 V), so that the memory transistors having insufficient threshold voltage shift turn on (data "1"), allowing detection of defective programming.

Then, reading is carried out to check the programmed data in step S7. If the determination is made in step S8 that the programming is false, processings are further carried out in steps S2–S7 to complete programming. If the program is done, the reading mode is set in step S9 to complete the programming.

Referring to FIG. 14B, an erase operation will be described. First in step S10, Vcc and Vpp are caused to rise and subsequently, "0" is programmed in all the bits in accordance with the above-described program flow processing in step S11. This is because, if the erased memory cells are further erased, one of memory cells in the memory cell array 1 might be over-erased. Then, the write enable signal $\overline{WE}$ is caused to fall to input the erase command. Namely, ($20_H$) is inputted in step S12. Subsequently in step S13, command inputting is carried out to start the erase and the erase pulse is internally generated at the same time as the rise of the write enable signal $\overline{WE}$. Namely, Vpp is applied to the sources of the memory cells through the source line switch 3. Thereafter, Vpp is applied to the source line 28 until the next falling of the write enable signal $\overline{WE}$. At the same time, the addresses are also latched in the address register 6 at the falling edge. In step S15, the erase verify command ($AO_H$) is inputted at the rise of the write enable signal $\overline{WE}$ to set the erasing verification mode.

In the erasing verification mode, the erase verify voltage ($\sim$3.2 V) is applied to the X decoder 4 and the Y gate 2 by the verify voltage generating circuit 11. As a result, the voltage applied to the control gates of the memory cells becomes lower than that (5 V) in the ordinary reading, so that insufficiently erased memory cells do not readily turn on (data "0").

Then, in step S16, reading is carried out to actually verify the erase. In step S17, if it is determined that the erase is insufficiently done, the erase is further repeated and if the erase is sufficiently done, the address is incremented to verify the erasing data of the next address in the step S18. If it is determined in step S19 that the verified address is the last, the operation mode is changed to the reading mode in step S20 to complete a series of operations.

Prior to shipment of the conventional flash EEPROM structured as described above, "0" should be surely written in all the bits or reading should be carried out to verify that all the bits are "0" before erase.

A user of the flash EEPROM might erroneously perform an erasing operation on the device which requires no further erase. This results in over-erase of the device.

SUMMARY OF THE INVENTION

Therefore, a primary object of the present invention is to provide a non-volatile semiconductor memory device allowing prevention of over-erasing of a device resulting from the repetition of erase operations due to an erroneous operation or the like.

Briefly stated, the present invention is a non-volatile semiconductor memory device comprising a plurality of memory cells arranged in an array of rows and columns and including electrically erasable non-volatile memory transistors to which information can be programmed, and row selecting means and column selecting means for decoding externally inputted address signals to select memory cells in a row direction and a column direction, respectively, wherein it is determined whether all the data read from the memory cells subjected to erasing is erased or not, so that an erase inhibiting mode signal is outputted in response to the determination that all the read data subjected to the erasing is erased and an erase-enable mode signal is outputted in response to the determination that the read data subjected to the erasing includes data "0".

Therefore, the present invention avoids over-erase resulting from an erroneous erasing operation because an erase inhibiting mode signal is outputted to inhibit an additional erase when all the read data have been completely erased after an erasing operation.

In a more preferred embodiment of the present invention, an erase-disable mode is set by releasing a latch of latching means at the detection of a rise of an power supply, or at the generation of an erase operation terminating signal, or at the detection of a fall of an erasing verifying signal and when one of the read data includes erased data or when a program signal is generated, an erase-enable mode is set by latching the latching means.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
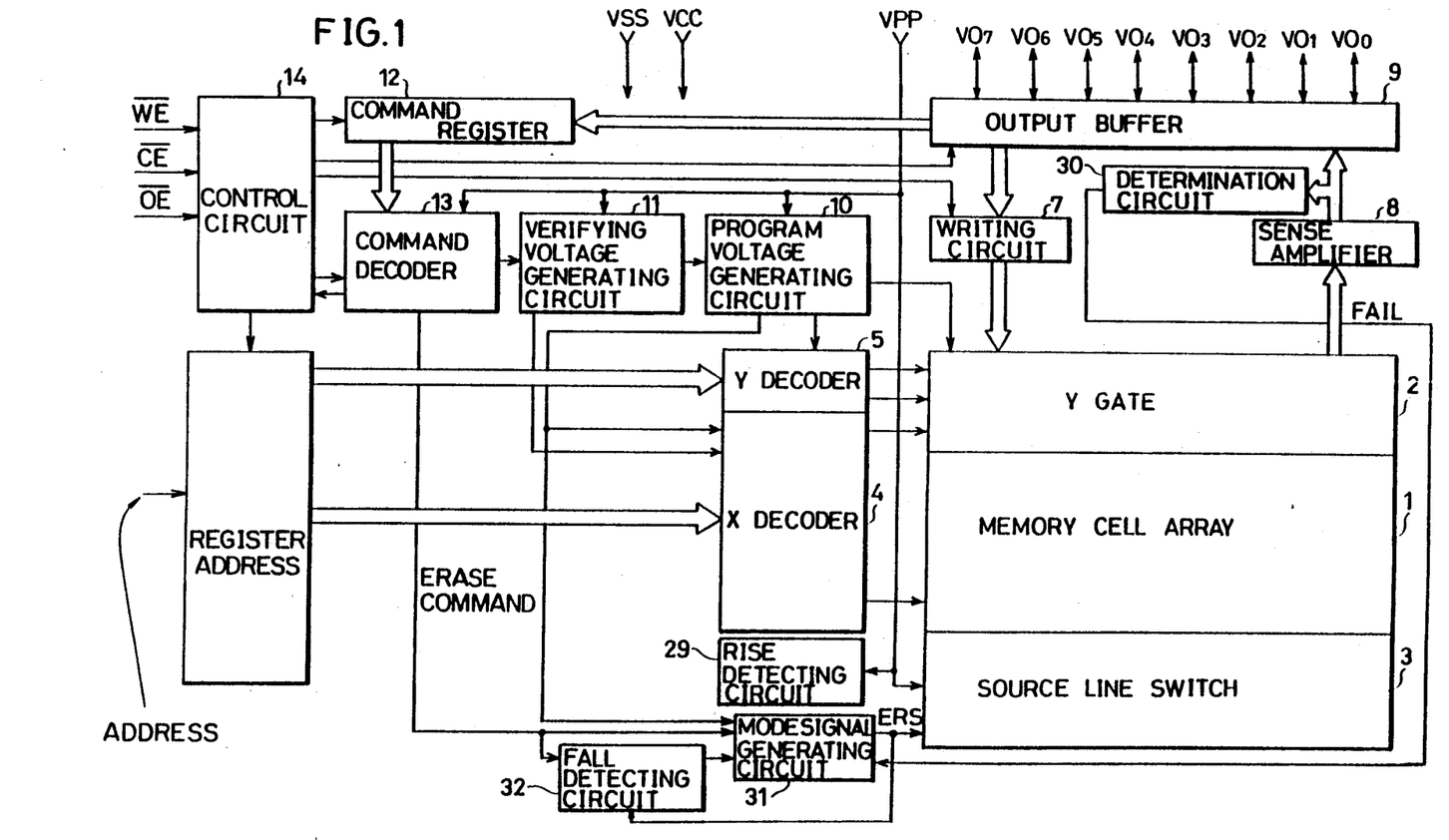
FIG. 1 is a schematic block diagram according to one embodiment of the present invention.

FIG. 1 is the schematic block diagram showing the entire structure of one embodiment of the present invention. The embodiment shown in FIG. 1 is the same as that of above-described FIG. 4 except for the following points. Namely, additionally provided are a rise detecting circuit 29, a determination circuit 30, a mode signal generating circuit 31 and a fall detecting circuit 32. The rise detecting circuit 29 detects a rise of Vpp or Vcc. The determination circuit 30 determines whether the read data is "1" or not in the erase-verification mode. The mode signal generating circuit 31 controls the source line switch 3. The fall detecting circuit 32 detects the end of the erasing pulse.

Figure 2:
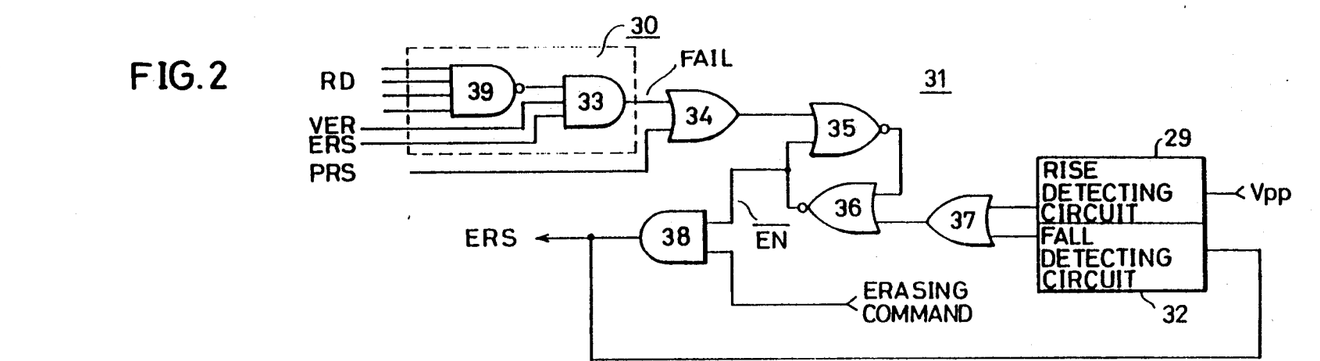
FIG. 2 is a specific block diagram of the rise detecting circuit, the determination circuit, the latch circuit and the fall detecting circuit shown in FIG. 1.

FIG. 2 is the specific block diagram of the rise detecting circuit, the determination circuit, the latch circuit and the fall detecting circuit shown in FIG. 1. Referring to FIG. 2, the determination circuit 30 includes an NAND gate 39 and an AND gate 33. The NAND gate 39 has an input connected to the output of the sense amplifier and detects whether all the read data is "1" or not. The output of the NAND gate 39 is applied to the AND gate 33. The AND gate 33 is further supplied with an erasing verifying signal VER and an erasing command signal ERS. The AND gate 33 outputs the output of the NAND gate 39 when the output enable signal $\overline{OE}$ is at the "L" level during the erasing verification (VER="H").

The output of the determination circuit 30 is applied to one input of an OR gate 34 and a program mode signal of PRS is applied to the other input. Then, the OR gate 34 outputs a signal of the "H" level to the mode signal generating circuit 31 when the output of the determination circuit 30 is at the "H" level or in the program mode (PRS ="H"). The mode signal generating circuit 31 comprises an R-S flip-flop constituted by NOR gates 35 and 36. The detection outputs of the rise detecting circuit 29 and the fall detecting circuit 32 are applied to the mode signal generating circuit 31 through an OR gate 37. Namely, the OR gate 37 outputs the "H" level signal to reset the mode signal generating circuit 31 at the fall of the rise detecting circuit 29 or an erasing pulse control signal ERS.

The output of the mode signal generating circuit 31 is applied to an AND gate 38. When the output of the mode signal generating circuit 31 is at the "H" level, the AND gate 38 outputs a signal of the "H" level.

Figure 3:
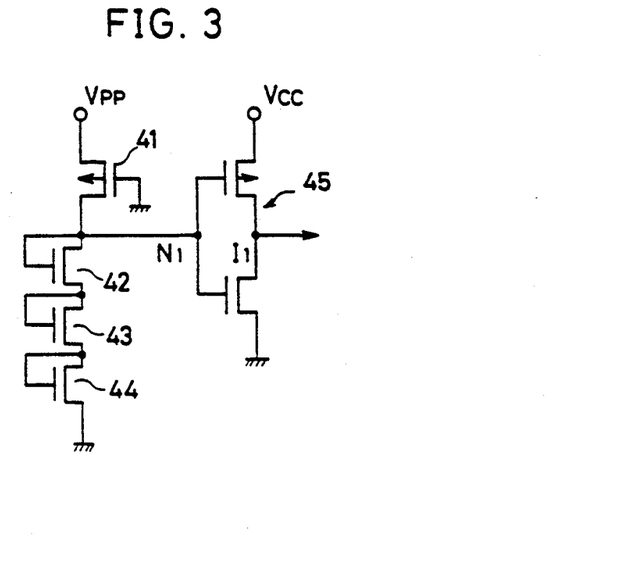
FIG. 3 is a specific electric circuit diagram of the rise detecting circuit shown in FIG. 2.
Figure 4:
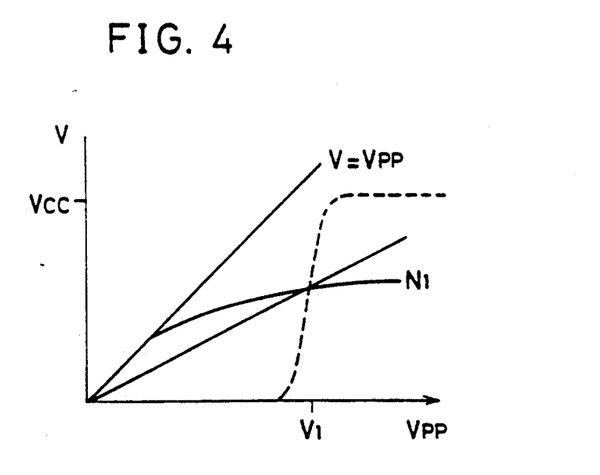
FIG. 4 is a diagram explaining operation of the rise detecting circuit shown in FIG. 3.

FIG. 3 is a specific electric circuit diagram of the rise detecting circuit shown in FIG. 2 and FIG. 4 is a diagram explaining operation of the rise detecting circuit shown in FIG. 3.

With reference to FIG. 3, a P channel MOS field effect transistor 41 and three N channel MOS field effect transistors 42-44 are connected in series between power supply Vpp and ground. An input N1 of an inverter 45 is connected to the node between the P channel MOS field effect transistor 41 and the N channel MOS field effect transistor 42 and an output I1 is applied to one input of the NOR gate 37 shown in FIG. 2.

When Vpp increases as shown in FIG. 4 upon application of power, the voltage of the input N1 of the inverter 45 increases while being divided by the P channel MOS field effect transistor 41 and the N channel MOS field effect transistors 42-44. Then, when Vpp exceeds $V_1$, the voltage of the input N1 of the inverter 45 exceeds a threshold voltage, and the inverter 45 outputs a "L" level.

Figure 5:
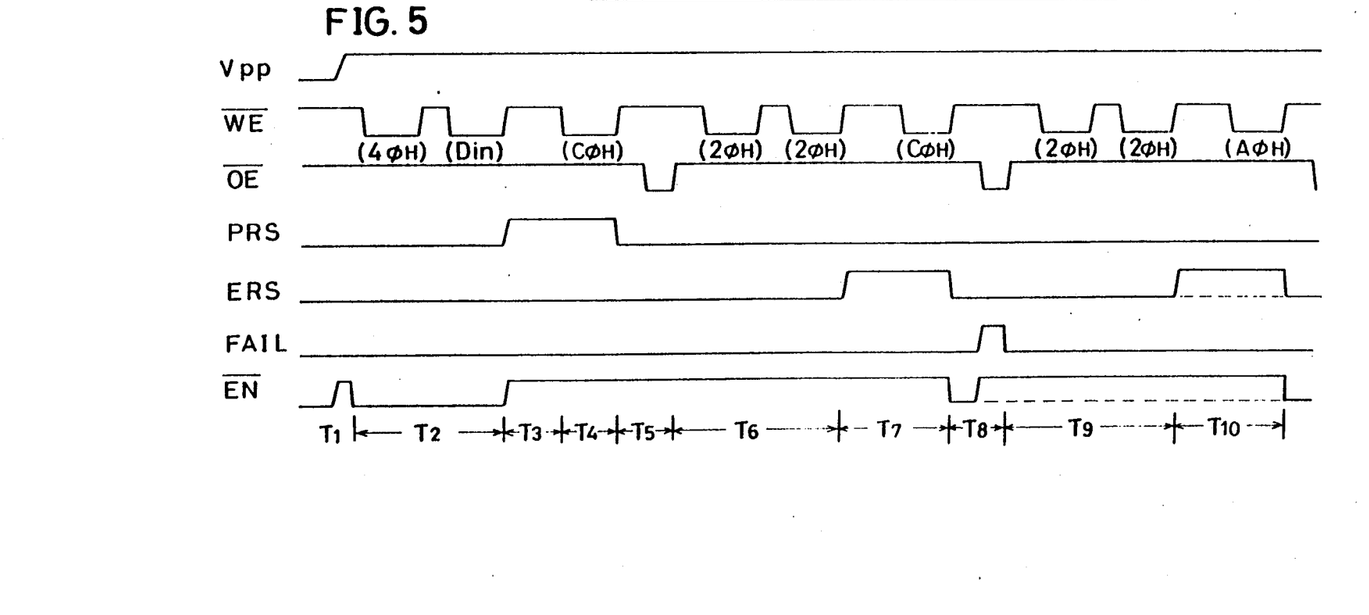
FIG. 5 is a timing chart explaining operations of one embodiment of the present invention.
Figure 6:
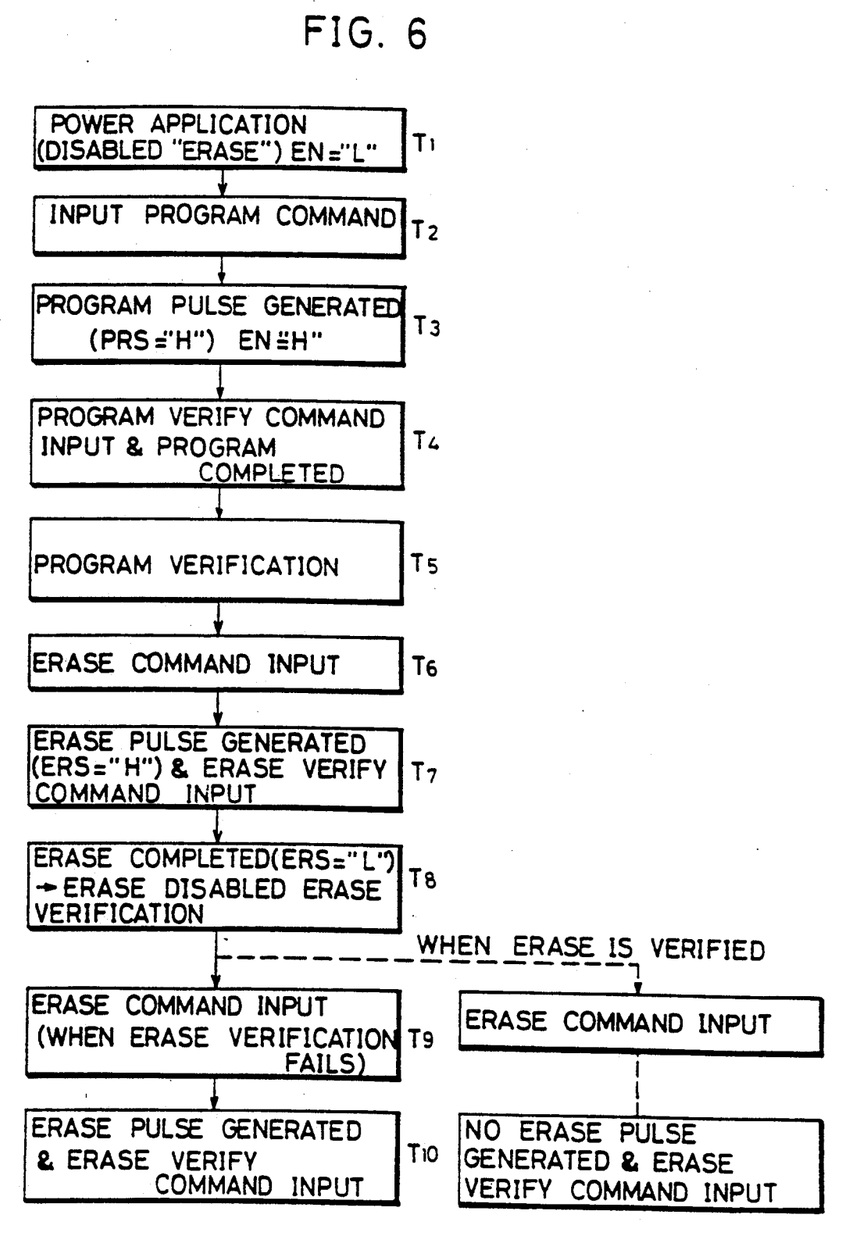
FIG. 6 is a flow chart explaining operation of one embodiment of the present invention.

FIG. 5 is the timing chart explaining operations of one embodiment of the present invention. FIG. 6 is a flow chart explaining operation of one embodiment of the present invention. Referring to FIGS. 1 through 6, the operations of one embodiment of the present invention will be described. Since reading and programming operations are the same as those in the prior art example, description will be made only of an erasing operation. First, Vpp is caused to rise at the timing T1 as shown in FIGS. 5 and 6 and the rise is detected by the rise detecting circuit 29. In response to the detection signal, the latch circuit 31 is reset, so that the output EN thereof attains the "L" level. Thereafter, writing is performed at the timing T2 in response to a program command in the same manner as in the conventional example and the program pulse control signal PRS rises at the timing T3, whereby the latch circuit 31 is set through the OR gate 34, so that EN attains the "H" level to enable erase.

Then, the program verifying command is inputted at the timing T4 and the programmed data is verified at the timing T5. Then, erasing is actually performed. Similarly to the conventional example, the erasing pulse control signal ERS is "H" at the timing T6, and Vpp is applied to the source 28 through the source line switch 3 at the time T7. Then, at the timing T8, the erasing verification mode is set upon the next rise of the write enable signal $\overline{WE}$ and at the same time, the erase-pulse control signal ERS falls to terminate the erasing pulse. At this time, the fall of ERS causes the AND gate 33 to generate pulses, so that the latch circuit 31 is reset, causing the output EN thereof to attain the "L" level to enter the erase-inhibit mode.

Then, the output enable signal $\overline{OE}$ falls so that the erasing verification is performed, resulting in the "H" level of VER. When all the read data is "1", the output of the NAND gate 39 attains the "L" level and the FAIL signal, the output of the NAND gate 33 remains at the "L" level as indicated by the dotted line in FIG. 5. Conversely, when the read data includes "0", the FAIL signal attains the "H" level as shown by the solid line and the EN is set to the "H" level. In this way, in the case of the erasing by again inputting the erasing command at the timing T9, if the erasing is completed, no erase pulse is generated as shown by the dotted line in FIG. 5 and if the erasing is not completed, additional erasing will be able to perform.

While in the above-described embodiment shown in FIG. 2, two NOR gates are used as the mode signal generating circuit 31, it is not limited thereto and NAND gates may be used or a J-K flip-flop may be used. Furthermore, the structure shown in FIG. 2 is not limited to that comprising the NAND gate 39, the AND gates 33 and 38, the OR gates 34 and 37 and the NOR gates 35 and 36, and it may be a combination of other logic circuits.

Furthermore, while in the above-described embodiment, the erase pulse generating circuit is activated or inactivated, a circuit receiving an external erase command can be used.

Figure 7:
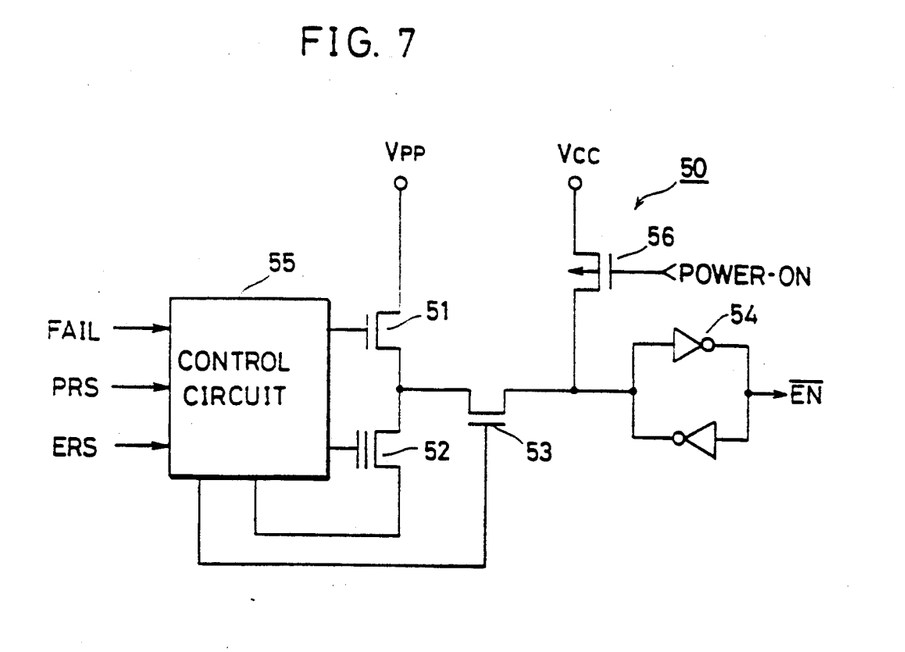
FIG. 7 is an electric circuit diagram of an non-volatile latch circuit.

FIG. 7 is a diagram showing an non-volatile latch circuit. An non-volatile latch circuit 50 shown in FIG. 7 stores an erase state of a memory cell and maintains the storage even when the power supply is turned off, thereby preventing a user from erroneously performing an erasing operation to the flash EEPROM prior to its use. More specifically, the non-volatile latch circuit 50 shown in FIG. 7 replaces the mode signal generating circuit 31 shown in FIG. 2. When a memory cell is erased, a control circuit 55 applies a write control signal to the gate of a write transistor 51. The write transistor 51 is connected to a memory transistor 52 for writing the memory transistor. The memory transistor 52 continues to store an erase state even when the power supply voltage Vpp is off. The gate of a P channel MOS field effect transistor 56 receives a rise signal from the rise detecting circuit 29 shown in FIG. 2, the gate of a gate transistor 53 receives a control signal from the control circuit 55, and the storage contents of the memory transistor 52 are applied through the gate transistor 53 to a latch circuit 54 wherein the contents are latched. The output EN of the latch circuit is applied to the AND gate 38 shown in FIG. 2.

Figure 8:
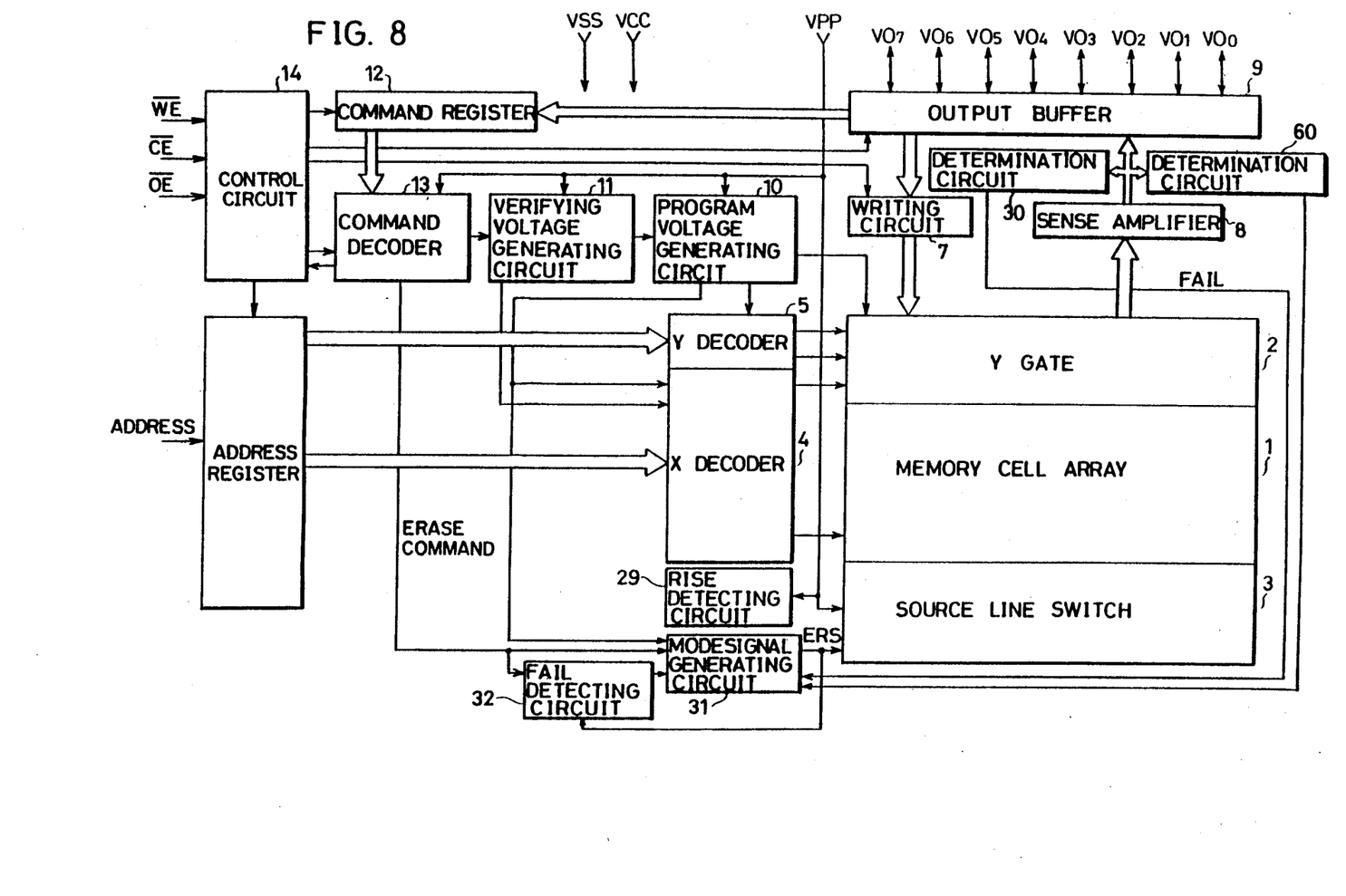
FIG. 8 is a schematic block diagram showing another embodiment of the present invention.

FIG. 8 is a schematic block diagram showing another embodiment of the present invention. The embodiment shown in FIG. 8 includes a determination circuit 60 connected to the output of the sense amplifier 8, which determination circuit makes a determination as to whether all the bytes of the read data from the memory cell array 1 are "$00_H$" or not. The determination circuit 60 makes a determination as to whether data of each byte read from the memory cell array 1 is "$00_H$" or not and stores the determination result in a memory contained therein. When a determination is made that all the bytes of the data are "$00_H$", the determination circuit 60 applies the determination output to the mode signal generating circuit 31. When the determination output is applied from the determination circuit 60, the mode signal generating circuit 31 outputs ERS to the source line switch 3 in response to an erase command.

Figure 9:
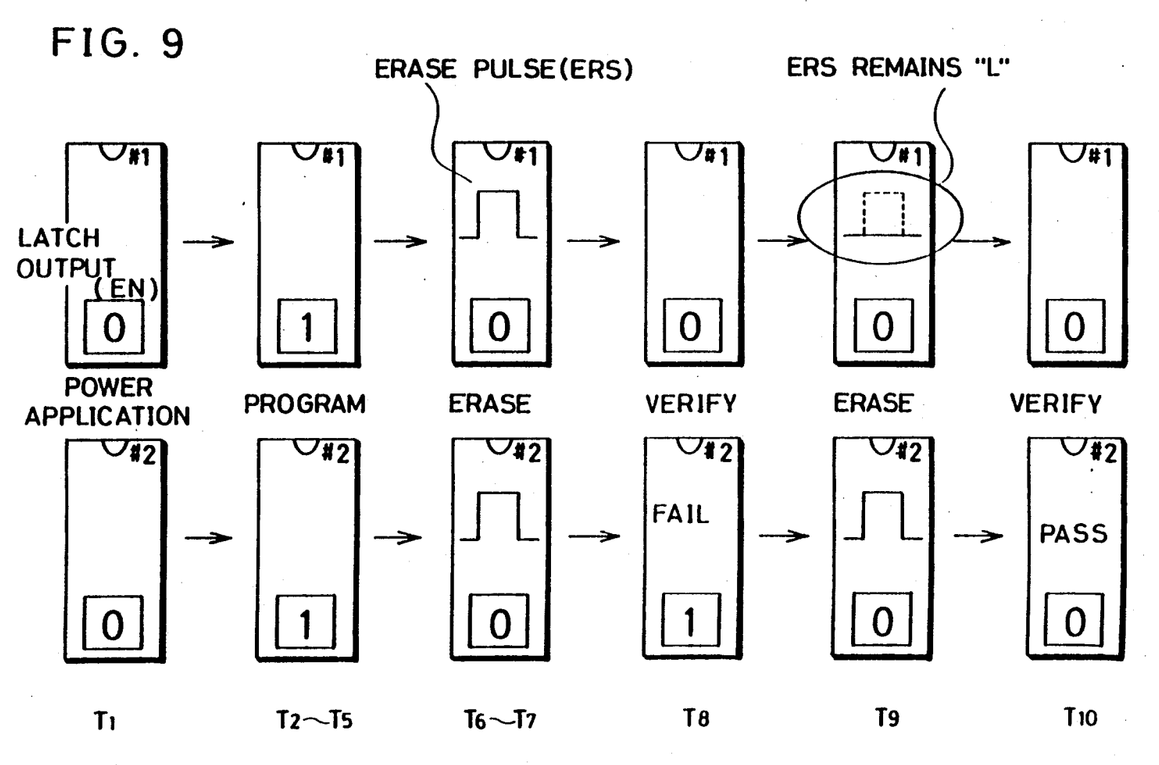
FIG. 9 is a diagram explaining a method of simultaneously erasing a plurality of chips according to one embodiment of the present invention.

FIG. 9 is a diagram explaining a method of simultaneously erasing a plurality of chips according to one embodiment of the present invention. In FIG. 9, two flash EEPROMs #1 and #2 are simultaneously subjected to erase operation. As described with reference to FIGS. 5 and 6, power is applied at timing T1 and the two flash EEPROMs #1 and #2 are programmed in response to a program command at timing T2–T5. Erase of each of the flash EEPROMs #1 and #2 is carried out at timing T6–T7 and erase verification is carried out at timing T8.

When completion of erase of one flash EEPROM #1 is verified and fail of erase of the other flash EEPROM #2 is verified, ERS of the flash EEPROM #1 is brought to a "L" level to inhibit an additional erase, so that only the other flash EEPROM #2 is again subjected an erase operation. Verification of erase is again carried out at timing T10.

As described above, for a simultaneous erase of a plurality of flash EEPROMs #1 and #2, additional erase is inhibited for an element an erase state of which is verified and additional erase is performed only for an element which has not been erased, thereby preventing over-erase.

As described in the foregoing, according to one embodiment of the present invention, the determination is made as to whether all the read data subjected to erasing is erased or not, an erase-inhibit mode signal is outputted if all the data is erased and an erase-enable mode signal is outputted in response to the determination that the read data includes data "0", so that over-erase can be avoided which is caused by successive erasing operations resulting from an erroneous operation. Furthermore, in simultaneously erasing of a plurality of chips, they are never over-erased even if the erase command is simultaneously inputted to all the chips.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device comprising:
    a plurality of memory cells arranged in an array of rows and columns and including electrically erasable non-volatile memory transistors to which information can be programmed,
    row selecting means for decoding externally inputted address signals to select memory cells in a row direction among said plurality of memory cells,
    column selecting means for decoding externally inputted address signals to select memory cells in a column direction among said plurality of memory cells,
    erase state determining means for determining whether or not data subjected to erasing from said memory cells is erased, and
    mode signal generating means responsive to a determination by said erase state determining means that said data is erased for outputting an erase-inhibit mode signal and responsive to a determination that said data is not erased for outputting an erase-enable mode signal.

2. A non-volatile semiconductor memory device comprising:

a plurality of memory cells arranged in an array of rows and columns and including electrically erasable non-volatile memory transistors to which information can be programmed, row selecting means for decoding externally inputted address signals to select memory cells in a row direction among said plurality of memory cells, column selecting means for decoding externally inputted address signals to select memory cells in a column direction among said plurality of memory cells, erase state determining means for determining whether or not data subjected to erasing from said memory cells is erased, and mode signal generating means responsive to a determination by said erase state determining means that said data is erased for outputting an erase-inhibit mode signal and responsive to a determination that said data is not erased for outputting an erase-enable mode signal, wherein said mode signal generating means includes latching means responsive to said erase state determining means.

3. The non-volatile semiconductor memory device according to claim 2, further comprising rise detecting means for detecting a voltage rise of an externally inputted power supply and releasing means for supplying a releasing signal to said latching means in response to detection of said voltage rise.

4. The non-volatile semiconductor memory device according to claim 2, further comprising:

erasing verifying signal generating means for generating an erasing verifying signal, and fall detecting means for detecting a voltage fall of said erasing verifying signal and releasing means for supplying a releasing signal to said latching means in response to the detection of said voltage fall.

5. The non-volatile semiconductor memory device according to claim 2, further comprising:

erasing operation terminating signal generating means indicative of the termination of the erasing operation, and means responsive to the output of said erasing operation terminating signal generating means for releasing the latch of said latch means.

6. The non-volatile semiconductor memory device according to claim 2, further comprising:

program signal generating means for generating a program signal; and gate means responsive to the program signal for latching said latching means.

7. The non-volatile semiconductor memory device according to claim 2, wherein said latching means includes non-volatile latching means.

8. In a non-volatile semiconductor memory device including a plurality of electrically erasable non-volatile memory cells comprising transistors, a method for erasing the charges stored in said memory cells without over-erasing, comprising the steps of:

commanding an erase operation simultaneously to each cell of the memory device;

determining whether charge stored in each cell is below a predetermined level;

successively repeating said performing and determining until it is determined that no cell stores charge at a level above said predetermined level; and disabling subsequent erase command in response to such determination.

9. In a non-volatile semiconductor memory device including a plurality of semiconductor chips each including a plurality of electrically erasable non-volatile memory cells; a method for erasing the charges stored in said memory cells without over-erasing comprising the steps of:

performing an erase operation simultaneously to all cells of the memory device;

for each semiconductor chip, determining whether charge stored in each cell is below a predetermined level;

successively repeating said performing and determining steps until it is determined that no cell in an individual chip stores charge at a level above said predetermined level; and disabling subsequent erase operation of cells of said individual chip in response to such determination.

* * * * *